United States Patent
Tanaka et al.

(10) Patent No.: US 9,972,676 B2
(45) Date of Patent: May 15, 2018

(54) SILICON CARBIDE SEMICONDUCTOR DEVICE

(71) Applicant: MITSUBISHI ELECTRIC CORPORATION, Chiyoda-ku (JP)

(72) Inventors: Rina Tanaka, Tokyo (JP); Yasuhiro Kagawa, Tokyo (JP); Naruhisa Miura, Tokyo (JP); Yuji Ebiike, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 46 days.

(21) Appl. No.: 15/109,962

(22) PCT Filed: Dec. 12, 2014

(86) PCT No.: PCT/JP2014/082929
§ 371 (c)(1),
(2) Date: Jul. 6, 2016

(87) PCT Pub. No.: WO2015/104949
PCT Pub. Date: Jul. 16, 2015

(65) Prior Publication Data
US 2016/0336391 A1    Nov. 17, 2016

(30) Foreign Application Priority Data
Jan. 10, 2014    (JP) .................... 2014-003014

(51) Int. Cl.
*H01L 29/15* (2006.01)
*H01L 29/06* (2006.01)
(Continued)

(52) U.S. Cl.
CPC ............ *H01L 29/063* (2013.01); *H01L 29/06* (2013.01); *H01L 29/1095* (2013.01);
(Continued)

(58) Field of Classification Search
CPC ............ H01L 29/063; H01L 29/66068; H01L 29/1095; H01L 29/1608; H01L 29/7813; H01L 29/78; H01L 29/06; H01L 29/12
See application file for complete search history.

(56) References Cited

U.S. PATENT DOCUMENTS 6,969,887 B2    11/2005    Mizukami et al.
7,368,783 B2    5/2008    Mizukami et al.
(Continued)

FOREIGN PATENT DOCUMENTS

JP    2005-236267 A    9/2005
JP    2012-4458 A    1/2012
(Continued)

OTHER PUBLICATIONS

International Preliminary Report on Patentability and Written Opinion dated Jul. 21, 2016 in PCT/JP2014/082929 filed Dec. 12, 2014 (with English language translation).
(Continued)

*Primary Examiner* — Syed Gheyas
(74) *Attorney, Agent, or Firm* — Oblon, McClelland, Maier & Neustadt, L.L.P.

(57) ABSTRACT

A silicon carbide semiconductor device includes: a drift layer of a first conductivity type made of silicon carbide; a well region of a second conductivity type formed on the drift layer; a source region of a first conductivity type formed on the well region; a gate insulating film formed on an inner wall of a trench extending from a front surface of the source region through the well region, at least a part of a side surface of the gate insulating film being in contact with the drift layer; a gate electrode formed in the trench with the gate insulating film therebetween; a protective layer of the second conductivity type formed in the drift layer; and a depletion suppressing layer of the first conductivity type
(Continued)

formed in the drift layer so as to be in contact with a side surface of the protective layer.

10 Claims, 8 Drawing Sheets

(51) Int. Cl.
    *H01L 29/78*    (2006.01)
    *H01L 29/12*    (2006.01)
    *H01L 29/10*    (2006.01)
    *H01L 29/16*    (2006.01)
    *H01L 29/66*    (2006.01)

(52) U.S. Cl.
    CPC .......... *H01L 29/12* (2013.01); *H01L 29/1608* (2013.01); *H01L 29/66068* (2013.01); *H01L 29/78* (2013.01); *H01L 29/7813* (2013.01)

(56) References Cited

U.S. PATENT DOCUMENTS

| | | | |
|---|---|---|---|
| 9,000,447 B2 | 4/2015 | Wada et al. | |
| 2005/0161732 A1* | 7/2005 | Mizukami | H01L 29/0623 257/327 |
| 2011/0291110 A1* | 12/2011 | Suzuki | H01L 29/1095 257/77 |
| 2016/0247910 A1* | 8/2016 | Suzuki | H01L 29/66068 |

FOREIGN PATENT DOCUMENTS

| | | | | |
|---|---|---|---|---|
| JP | 2013-69964 A | 4/2013 | | |
| JP | 2013-98315 | 5/2013 | | |
| JP | 2015-72999 | 4/2015 | | |
| WO | WO 2012077617 A1 * | 6/2012 | .......... | H01L 29/7811 |
| WO | WO 2012/165329 A1 | 12/2012 | | |
| WO | WO 2014/207793 A1 | 12/2014 | | |

OTHER PUBLICATIONS

International Search Report dated Mar. 17, 2015, in PCT/JP2014/082929 Filed Dec. 12, 2014.

Office Action dated Jun. 6, 2017 in Japanese Patent Application No. 2015-556745 (with Partial English translation).

\* cited by examiner

F I G. 2 1
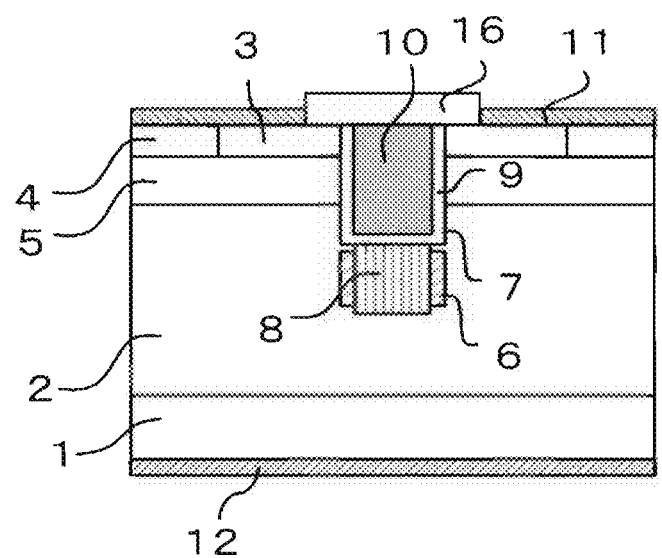

SILICON CARBIDE SEMICONDUCTOR DEVICE

TECHNICAL FIELD

The present invention relates to trench-gate silicon carbide semiconductor devices and a method for manufacturing the same.

BACKGROUND ART

Insulated gate semiconductor devices, such as metal oxide semiconductor field effect transistors (MOSFETs) and insulated gate bipolar transistors (IGBTs), are widely used as power switching devices. In an insulated gate semiconductor device, a channel is formed in a well region when a voltage equal to or higher than a threshold voltage is applied to a gate electrode, and the insulated gate semiconductor device can be brought into the on state accordingly. The insulated gate semiconductor devices are put to practical use as trench-gate semiconductor devices. In such a trench-gate semiconductor device, a trench is formed so as to extend from the front surface of a semiconductor layer to a drift layer, and a well region on the side surface of the trench is used as a channel. This configuration can improve the density across the channel width, so that the cell pitch can be reduced to improve the performance capabilities of the device.

Semiconductor devices made of silicon carbide (SiC) (hereinafter referred to as "silicon carbide semiconductor devices") have received attention as the next generation of high-voltage and low-loss semiconductor devices, and development has been proceeding on trench-gate silicon carbide semiconductor devices.

Unfortunately, the electric field is concentrated in the trench bottom when a high voltage is applied to the trench-gate semiconductor device in the off state. In particular, the electric field concentration in the trench bottom of the trench-gate silicon carbide semiconductor device is often a matter of concern because SiC has a high dielectric strength and thus the electric field concentration in the trench bottom is likely to cause a breakdown of a gate insulating film before an avalanche breakdown occurs in the drift layer.

To reduce the electric field concentration in the trench bottom, a configuration has been proposed which includes, in the trench, a protective layer having a conductivity type different from that of the drift layer. For example, in a case where the protective layer is provided in the drift layer below the trench, a depletion layer extends from the protective layer in the off state, and the electric field in the trench bottom can be reduced accordingly (see, for example, Patent Document 1).

PRIOR ART DOCUMENT

Patent Document

Patent Document 1: Japanese Patent Application Laid-Open No. 2013-69964

SUMMARY OF INVENTION

Problems to be Solved by the Invention

However, with the protective layer being provided in the drift layer, the depletion layer laterally extends in the drift layer from the protective layer while the semiconductor device is in the on state. This depletion layer narrows a path of a current flowing through the semiconductor device, and the on resistance increases accordingly.

The present invention therefore has been made to solve the above-mentioned problems, and an object thereof is to provide a silicon carbide semiconductor device capable of suppressing an increase in on resistance.

Means to Solve the Problems

A silicon carbide semiconductor device according to the present invention includes a drift layer of a first conductivity type made of silicon carbide; a well region of a second conductivity type formed on the drift layer; a source region of a first conductivity type formed on the well region; a gate insulating film formed on an inner wall of a trench extending from a front surface of the source region through the well region, at least a part of a side surface of the gate insulating film being in contact with the drift layer; a gate electrode formed in the trench with the gate insulating film therebetween; a protective layer of the second conductivity type formed in the drift layer; and a depletion suppressing layer of the first conductivity type formed in the drift layer so as to be in contact with a side surface of the protective layer, the depletion suppressing layer having a first-conductivity-type impurity concentration higher than that of the drift layer and having a bottom surface located at a depth above a bottom surface of said protective layer.

Effects of the Invention

The device according to the present invention includes the depletion suppressing layer formed on the side surface of the protective layer and having a first-conductivity-type impurity concentration higher than that of the drift layer. Thus, the extension of the depletion layer from the protective layer is suppressed in the on state, such that the current path is less likely to be narrowed down. This configuration can suppress an increase in the on resistance of the silicon carbide semiconductor device.

BRIEF DESCRIPTION OF DRAWINGS

FIG. 21 A cross-sectional view of a silicon carbide semiconductor device according to a modification of the third embodiment.

DESCRIPTION OF EMBODIMENTS

First Embodiment

Figure 1:
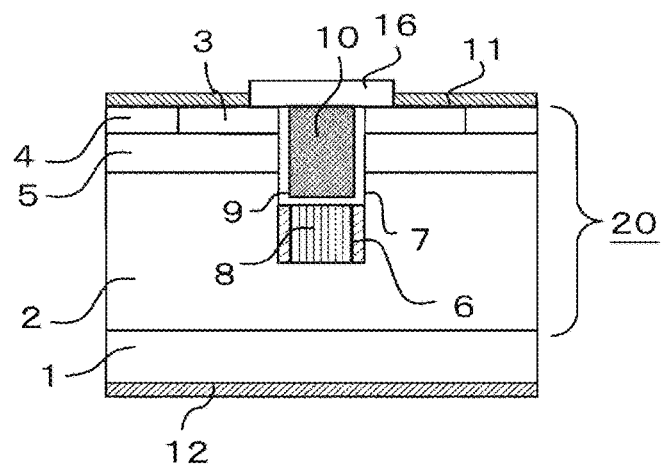
FIG. 1 A cross-sectional view of a silicon carbide semiconductor device according to a first embodiment.

The following describes a configuration of a silicon carbide semiconductor device according to this embodiment. FIG. 1 is a cross-sectional view of a silicon carbide semiconductor device according to a first embodiment. In the following paragraphs, the "impurity concentration" refers to the peak value associated with the impurity in the individual region, and the "width" and the "thickness" of the individual region having a distribution of impurity concentration refer to the width and the thickness of an area in which the impurity concentration is equal to or greater than a half the peak value of the impurity concentration in the relevant region.

With reference to FIG. 1, the silicon carbide semiconductor device includes a substrate 1, a semiconductor layer 20, a gate electrode 10, a source electrode 11, and a drain electrode 12. The semiconductor layer 20 is formed on the front surface of the substrate 1 and the drain electrode 12 is formed on the rear surface of the substrate 1. In the front surface of the semiconductor layer 20, a trench 7 is formed. In the trench 7, a gate insulating film 9 and the gate electrode 10 are formed. In a region over the semiconductor layer 20, an interlayer insulating film 16 is formed over the trench 7 so as to cover the gate electrode 10. The source electrode 11 is formed in the remaining region over the semiconductor layer 20.

The substrate 1 is an n-type silicon carbide semiconductor substrate. The semiconductor layer 20 is a semiconductor layer obtained by epitaxially growing a silicon carbide semiconductor. The semiconductor layer 20 includes a source region 3, a well contact region 4, and a well region 5. The remaining region of the semiconductor layer 20 is a drift layer 2.

The drift layer 2 is an n-type semiconductor layer located on the substrate 1 and is a semiconductor layer having an n-type impurity concentration lower than that of the substrate 1. In the drift layer 2, a depletion suppressing layer 6 and a protective layer 8 are formed. The depletion suppressing layer 6 is an n-type semiconductor layer and is a semiconductor layer having an n-type impurity concentration higher than that of the drift layer 2. The protective layer 8 is a p-type semiconductor layer and is formed to reduce the electric field on the bottom surface of the trench 7. The depletion suppressing layer 6 is formed so as to be in contact with the side surface of the protective layer 8 and is formed to suppress the extension of a depletion layer from the protective layer 8.

The well region 5 is formed on the drift layer 2. The well region 5 is a p-type semiconductor region. The well contact region 4 and the source region 3 are formed on the well region 5. The well contact region 4 is a p-type semiconductor region and is a region having a p-type impurity concentration higher than that of the well region 5. The source region 3 is an n-type semiconductor region. In the drift layer 2 below the well region 5 may be provided a region having an n-type impurity concentration higher than that of the drift layer 2, such that current diffusion occurs and the extension of the depletion layer from the well region 5 is suppressed.

The trench 7 is formed so as to extend from the front surface of the semiconductor layer 20, or in particular, from the front surface of the source region 3 through the well region 5 to the drift layer 2. The gate insulating film 9 is formed on the inner wall (the bottom surface and the side surface) of the trench 7. The gate electrode 10 is formed on the gate insulating film 9 so as to be embedded in the trench 7.

On the front surface of the semiconductor layer 20, the source electrode 11 is formed so as to be in contact with the source region 3 and the well contact region 4. The source electrode 11 is made of a silicide including the semiconductor layer 20 and a metal, such as nickel (Ni) or titanium (Ti), and is in ohmic contact with the source region 3 and the well contact region 4. The drain electrode 12 is formed on the rear surface of the substrate 1. The drain electrode 12 is a metal electrode made of, for example, Ni.

In this embodiment, the protective layer 8 and the depletion suppressing layer 6 are formed in the drift layer 2 below the trench 7 (or at least in a portion of the drift layer 2 immediately below the trench 7) so as to be in contact with the bottom surface of the gate insulating film 9. The depletion suppressing layer 6 is formed so as to be in contact with the side surface of the protective layer 8. The depletion suppressing layer 6 is not in contact with the side surface of the gate insulating film 9. The source region 3, the well region 5, and the drift layer 2 are formed so as to be in contact with the side surface of the gate insulating film 9. Both the depletion suppressing layer 6 and the protective layer 8 are in contact with the bottom surface of the gate insulating film 9. With reference to FIG. 1, the width of the protective layer 8 in contact with the bottom surface of the gate insulating film 9 is greater than the width of the depletion suppressing layer 6 in contact with the bottom surface of the gate insulating film 9.

The following describes impurity concentrations of the individual semiconductor layers and the individual regions. The n-type impurity concentration in the drift layer 2 is in a range of $1.0 \times 10^{14}$ to $1.0 \times 10^{17}$ cm$^{-3}$ and is set on the basis of, for example, the withstand voltage of the silicon carbide semiconductor device. The p-type impurity concentration in the well region 5 is in a range of $1.0 \times 10^{14}$ to $1.0 \times 10^{18}$ cm$^{-3}$. The n-type impurity concentration in the source region 3 is in a range of $1.0 \times 10^{18}$ to $1.0 \times 10^{21}$ cm$^{-3}$. The p-type impurity concentration in the well contact region 4 is in a range of $1.0 \times 10^{18}$ to $1.0 \times 10^{21}$ cm$^{-3}$ and is set to be higher than the p-type impurity concentration in the well region 5 such that the contact resistance to the source electrode 11 is reduced.

The n-type impurity concentration in the depletion suppressing layer 6 is set to be higher than the n-type impurity concentration in the drift layer 2 and is set at $1.0 \times 10^{17}$ cm$^{-3}$ or higher and $5.0 \times 10^{17}$ cm$^{-3}$ or lower, or more preferably, is set at $2.0 \times 10^{17}$ cm$^{-3}$ or higher. The depletion suppressing layer 6 suppresses the extension of the depletion layer from the protective layer 8. The p-type impurity concentration in the protective layer 8 is preferably set at $5.0 \times 10^{17}$ cm$^{-3}$ or higher and $5.0 \times 10^{18}$ cm$^{-3}$ or lower.

The following briefly describes the operation of the silicon carbide semiconductor device. With reference to FIG. 1, conductivity reversal occurs in the well region 5 when a voltage equal to or higher than the threshold voltage is applied to the gate electrode 10. This means that an n-type channel is formed along the side surface of the trench 7. Consequently, a current path of the same conductivity type is formed to extend from the source electrode 11 to the drain electrode 12, and a current flows through the path accordingly. Thus, the state in which a voltage equal to or higher than the threshold voltage is applied to the gate electrode 10 is the on state of the silicon carbide semiconductor device.

In a case where a voltage less than the threshold voltage is applied to the gate electrode 10, meanwhile, a channel is not formed in the well region 5. Thus, unlike in the on state, a current path is not formed. When a voltage is applied between the drain electrode 12 and the source electrode 11, a current does not flow from the drain electrode 12 to the source electrode 11. Thus, the state in which a voltage less than the threshold voltage is applied to the gate electrode 10 (between the gate and the source) is the off state of the silicon carbide semiconductor device. The voltage applied to the gate electrode 10 is managed such that the silicon carbide semiconductor device is switched between the on state and the off state.

The following describes a method for manufacturing the silicon carbide semiconductor device. Each of FIGS. 2 to 6 is a cross-sectional view illustrating the individual step in the method for manufacturing the silicon carbide semiconductor device according to this embodiment.

Figure 2:
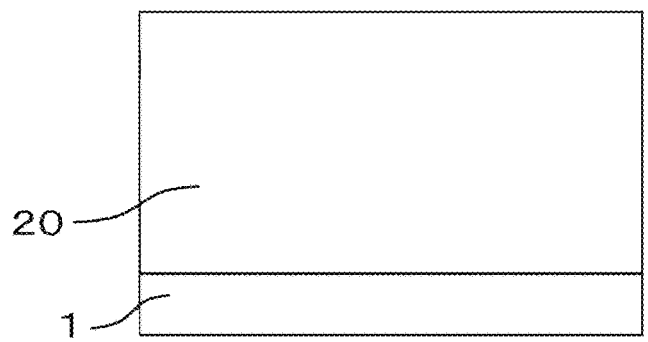
FIG. 2 A cross-sectional view illustrating a method for manufacturing the silicon carbide semiconductor device according to the first embodiment.

With reference to FIG. 2, the substrate 1 is prepared, with the n-type semiconductor layer 20 made of silicon carbide being formed thereon. In particular, the epitaxial growth method may be used to form the n-type semiconductor layer 20 on the substrate 1 being an n-type silicon carbide substrate. The semiconductor layer 20 is formed so as to have an n-type impurity concentration corresponding to the n-type impurity concentration of the drift layer 2 mentioned above.

Figure 3:
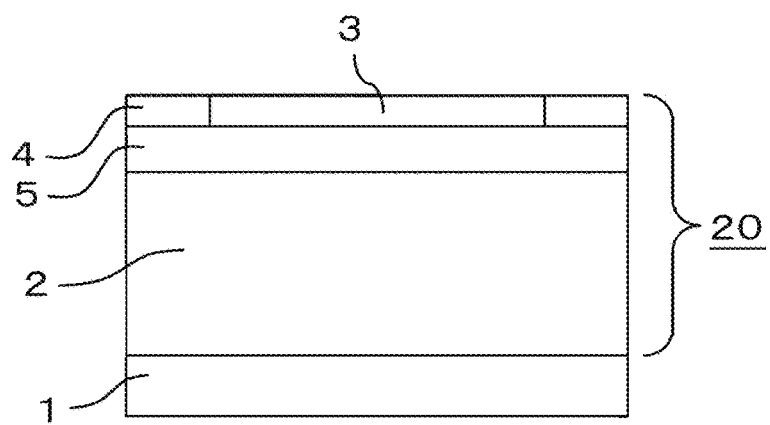
FIG. 3 A cross-sectional view illustrating the method for manufacturing the silicon carbide semiconductor device according to the first embodiment.

With reference to FIG. 3, the source region 3, the well contact region 4, and the well region 5 are individually formed in the upper portion of the semiconductor layer 20 by ion implantation. The ion implantation involves implantation of donors such as nitrogen (N) ions in the formation of an n-type region or implantation of acceptors such as aluminum (Al) ions in the formation of a p-type region. These regions are formed such that the above-mentioned values of impurity concentration are obtained for the individual regions. The individual regions may be formed in an order different from the above-mentioned order. The formation of all or part of the regions may involve epitaxial growth, instead of ion implantation.

Figure 4:
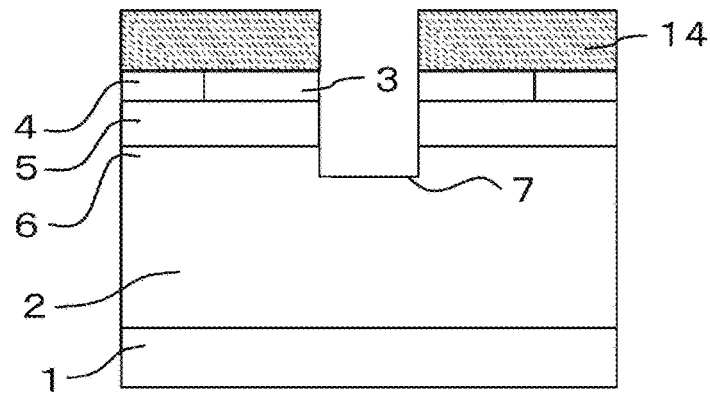
FIG. 4 A cross-sectional view illustrating the method for manufacturing the silicon carbide semiconductor device according to the first embodiment.

With reference to FIG. 4, the trench 7 is formed, by reactive ion etching (RIE), so as to extend from the front surface of the source region 3 through the well region 5 to the drift layer 2.

Figure 5:
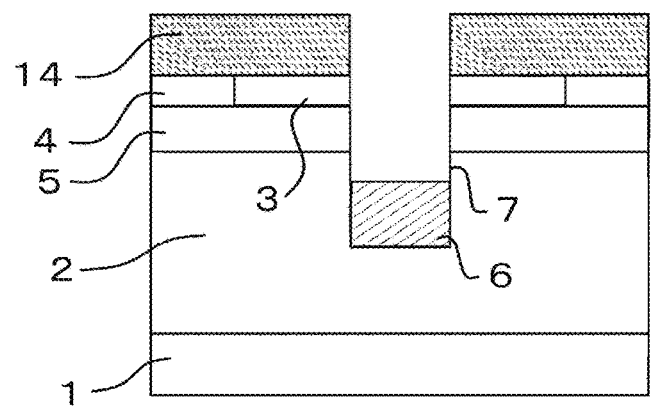
FIG. 5 A cross-sectional view illustrating the method for manufacturing the silicon carbide semiconductor device according to the first embodiment.

With reference to FIG. 5, the bottom surface of the trench 7 is implanted with n-type ions, so that the depletion suppressing layer 6 is formed. As illustrated in FIG. 5, the depletion suppressing layer 6 is formed through the use of a mask 14 having an opening above the bottom surface of the trench 7. The formation of the depletion suppressing layer 6 may involve the formation of the trench 7 having the additional thickness corresponding to the thickness of the depletion suppressing layer 6 and the subsequent epitaxial growth of the depletion suppressing layer 6 in the trench. Alternatively, in the formation of the semiconductor layer 20, the depletion suppressing layer 6 may be epitaxially grown to be embedded in the semiconductor layer 20 in advance.

Figure 6:
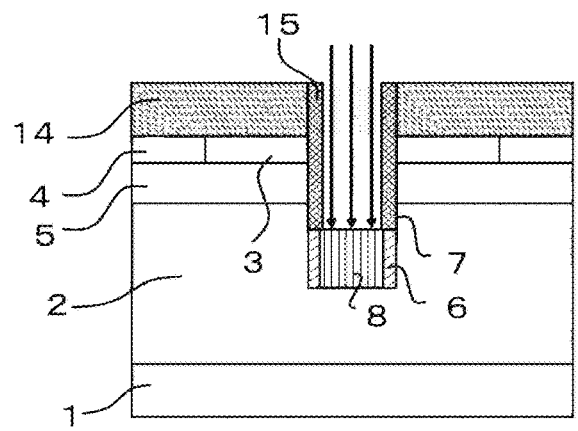
FIG. 6 A cross-sectional view illustrating the method for manufacturing the silicon carbide semiconductor device according to the first embodiment.

With reference to FIG. 6, a side wall mask 15 is formed by deposition of a mask material, such as a silicon oxide film, on the side surface and the bottom surface of the trench 7 and by formation of an opening in the region for forming the protective layer 8. The side wall mask 15 may be formed by thermal oxidation of the trench 7. With the side wall mask 15 being formed, the bottom surface of the trench 7 is implanted with p-type ions, so that the protective layer 8 is formed. The protective layer 8 is desirably connected with the source electrode 11 through, for example, adjacent cells such that the protective layer 8 has a fixed potential (is grounded).

After the side wall mask 15 is removed, the gate insulating film 9 is formed on the inner bottom surface and the inner side surface of the trench 7. Then, the gate electrode 10 is formed on the gate insulating film 9 so as to be embedded in the trench 7. After the interlayer insulating film 16 is formed so as to cover the gate electrode 10, the source electrode 11 is formed so as to be in contact with the front surface of the source region 3 and the front surface of the well contact region 4, and the drain electrode 12 is formed on the rear surface of the substrate 1. The silicon carbide semiconductor device illustrated in FIG. 1 is produced through the above-mentioned steps.

Figure 7:
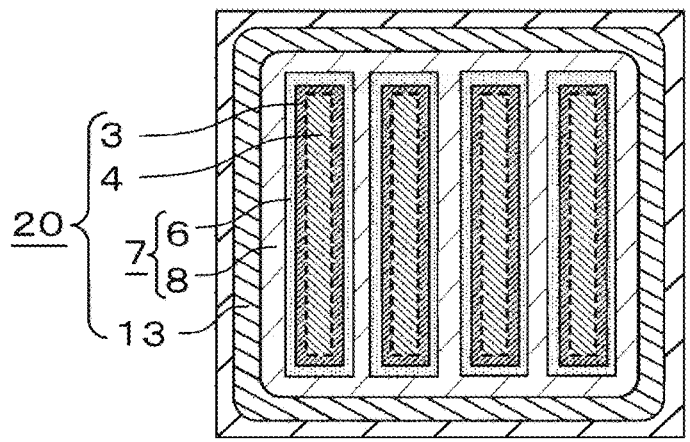
FIG. 7 A plan view illustrating an example of a cell arrangement according to the first embodiment.
Figure 8:
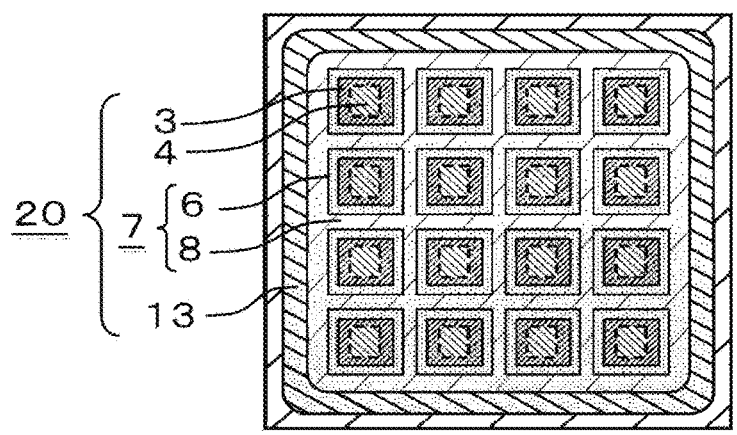
FIG. 8 A plan view illustrating another example of the cell arrangement according to the first embodiment.

In this embodiment, the planar arrangement of cells may have a stripe pattern as illustrated in a plan view in FIG. 7 or a lattice pattern as illustrated in a plan view in FIG. 8. For the lattice-pattern arrangement, it is not required that the individual cells be in alignment and the individual cell may have a polygonal shape or a shape with corner curvature.

The source region 3 and the well contact region 4 are formed to have a stripe pattern in FIG. 7 or an island pattern in FIG. 8. The well region 5 is formed below the source region 3 and the well contact region 4. The trenches 7 are formed to have a stripe pattern or a lattice pattern in such a manner that the trenches 7 are in contact with the side surface of the source region 3. The depletion suppressing layers 6 and the protective layers 8 are formed to have the same pattern as that of the trenches 7. On the periphery of the region in which cells are arranged, a termination region 13 is formed. The termination region 13 may be obtained by forming a p-type impurity layer on the front surface of the device or by forming a p-type impurity layer on the bottom surfaces of the trenches formed by etching.

Figure 9:
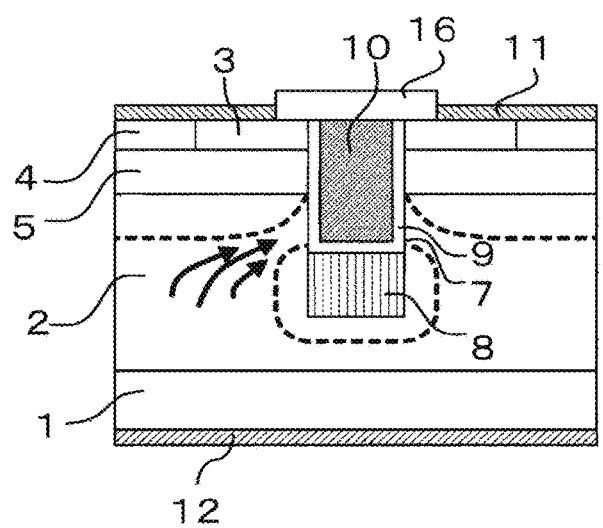
FIG. 9 A cross-sectional view of a silicon carbide semiconductor device according to an example compared to the first embodiment.
Figure 10:
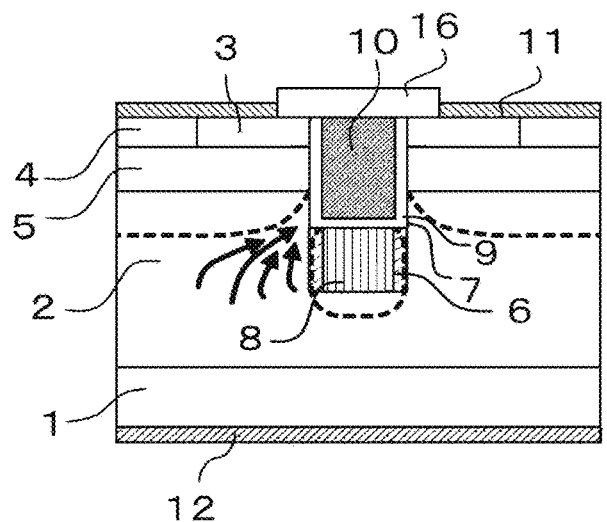
FIG. 10 A cross-sectional view of the silicon carbide semiconductor device according to the first embodiment.

The silicon carbide semiconductor device according to this embodiment produces effects which will be described below. FIG. 9 is a schematic view of a current path of a silicon carbide semiconductor device in an example compared to this embodiment. FIG. 10 is a schematic view of a current path of the silicon carbide semiconductor device according to this embodiment.

The silicon carbide semiconductor device according to a comparative example includes the protective layer 8 formed in the drift layer 2 below the trench but does not include the depletion suppressing layer 6 on the side surface of the protective layer 8. In this case, as illustrated in FIG. 9, the path of an on current is reduced by a depletion layer extending from well region 5 and a depletion layer extending from the protective layer 8 on the bottom surface of the trench, and the on resistance is likely to increase accordingly. In this embodiment, meanwhile, the depletion suppressing layer 6 having an n-type impurity concentration higher than that of the drift layer 2 is formed on the side surface of the protective layer 8. Thus, as illustrated in FIG. 10, the depletion layer extending from the protective layer 8 in the on state has a smaller width, and the path of the on current is expanded compared to the path of the on current in the comparative example. Consequently, an increase in on resistance is suppressed.

If the depletion suppressing layer 6 having an n-type impurity concentration higher than that of the drift layer 2 is provided, an electric field in the drift layer 2, particularly, below the trench 7 could increase. Thus, it is important to confine the depletion suppressing layer 6 in a requisite minimum area. In this embodiment, the depletion suppressing layer 6 is provided only on the side surface of the protective layer 8, and thus the side surface of the gate insulating film 9 is in contact with the drift layer 2. This configuration suppresses an increase in the electric field applied to the gate insulating film 9. The individual depletion suppressing layers 6 of the adjacent cells are formed separately from each other with the drift layer 2 therebetween. Unlike the indiscrete depletion suppressing layer 6 formed across adjacent cells, the individual depletion suppressing layers 6 can further suppress an increase in the electric field in the drift layer 2.

In this embodiment, the individual depletion suppressing layer 6 and the individual protective layer 8 are in contact with the gate insulating film 9. As illustrated in FIG. 1, the width of the depletion suppressing layer 6 in contact with the gate insulating film 9 is desirably smaller than the width of the protective layer 8 in contact with the gate insulating film 9.

As described above, it is important to reliably suppress the extension of the depletion layer from the protective layer 8 in the on state and to deal with an increase in the electric field caused by the depletion suppressing layer 6 having a higher impurity concentration. Thus, the impurity concentration in the depletion suppressing layer 6 needs to be equal to or greater than the concentration required to confine the depletion layer extending from the protective layer 8 within the depletion suppressing layer 6 in the on state and needs to be adjusted such that the electric field in the drift layer is not intensified in response to application of a high bias to the drain electrode 12 in the off state.

Figure 11:
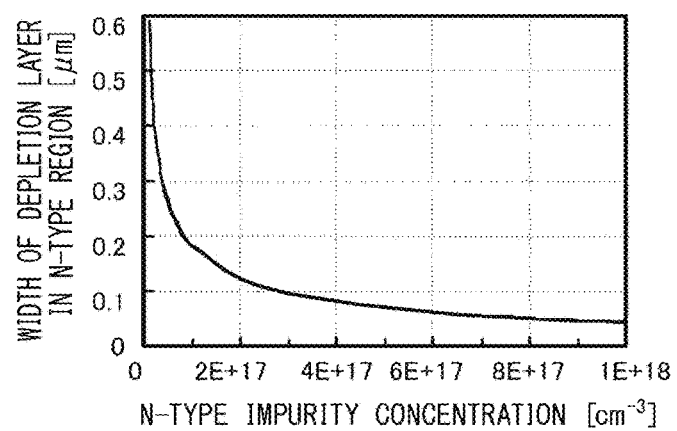
FIG. 11 A graph illustrating the relation between the n-type impurity concentration and the width of a depletion layer in an n-type region in a pn junction portion.

FIG. 11 is a graph illustrating the relation between the n-type impurity concentration and the width of a depletion layer in an n-type region in a simple pn junction. FIG. 11 is given assuming that the p-type impurity is set at $1.0 \times 10^{18}$ $cm^{-3}$ and that a voltage is perpendicularly applied to the pn junction. As illustrated in FIG. 11, the width of the depletion layer increases as the n-type impurity concentration decreases, and the width of the depletion layer begins to increase sharply when the impurity concentration becomes lower than about $1.0 \times 10^{17}$ $cm^{-3}$. The amount of reduction in the width of the depletion layer is on the decrease while the impurity concentration is equal to or higher than about $5.0 \times 10^{17}$ $cm^{-3}$. Increasing the impurity concentration can hardly produce the effect of achieving a greater reduction in the width of the depletion layer. In this embodiment, the n-type impurity concentration in the depletion suppressing layer 6 is set at $1.0 \times 10^{17}$ $cm^{-3}$ or higher and $5.0 \times 10^{17}$ $cm^{-3}$ or lower, or more preferably, is set at $2.0 \times 10^{17}$ $cm^{-3}$ or higher.

Figure 12:
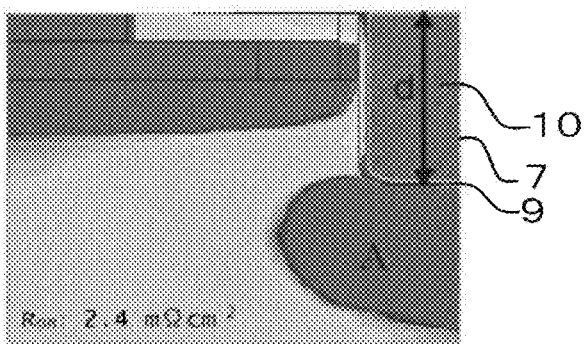
FIG. 12 A distribution map illustrating the on-current density of the silicon carbide semiconductor device according to the example compared to the first embodiment.
Figure 13:
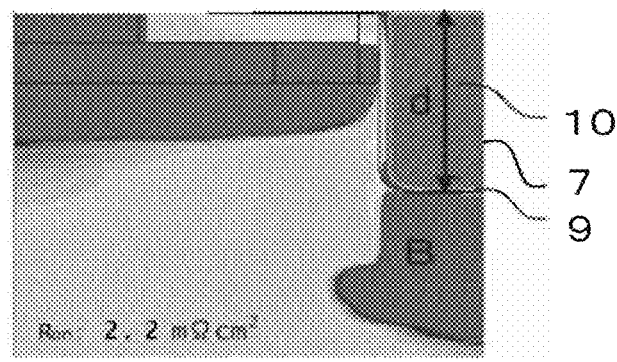
FIG. 13 A distribution map of the on-current density of a silicon carbide semiconductor device according to a first example of the first embodiment.
Figure 14:
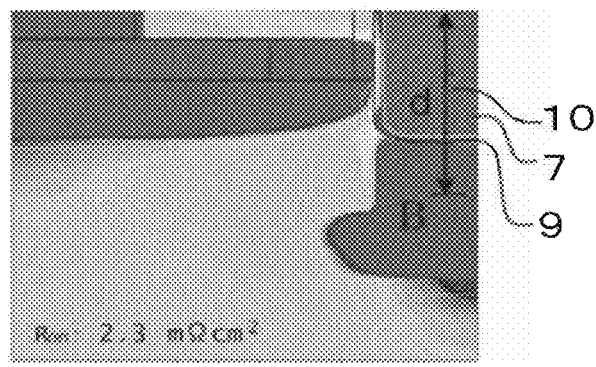
FIG. 14 A distribution map of the on-current density of a silicon carbide semiconductor device according to a second example of the first embodiment.

FIGS. 12 to 14 show simulation results on the on-current density distributions in the silicon carbide semiconductor device according to the comparative example, a silicon carbide semiconductor device according to a first example of this embodiment, and a silicon carbide semiconductor device according to a second example of this embodiment. Each drawing shows the current density distribution of a portion extending longitudinally from the lower end of the source region 3 to a depth of several μm below the protective layer 8 and extending transversely from the center of the well contact region 4 to the center of the trench 7. The region filled in with white is the region in which the current density is higher and the region filled in with black is the region in which the current density is lower. The silicon carbide semiconductor device illustrated in FIG. 9 is used in the comparative example. The silicon carbide semiconductor device according to the first example is configured in such a manner that the trench 7 has the same depth as that of the trench of the silicon carbide semiconductor device according to the comparative example. The silicon carbide semiconductor device according to the second example is obtained by reducing the depth of the trench 7 of the silicon carbide semiconductor device according to the comparative example by 500 nm.

The region denoted by "A" in FIG. 12 includes the protective layer 8 and the depletion layer extending from the protective layer 8. It is obvious that no current flows in this region. The on resistance of the device in the comparative example is found to be 2.4 mΩ cm². The region denoted by "B" in each of FIGS. 13 and 14 corresponds to the region denoted by "A" in FIG. 12. It is obvious that the transverse width of the region denoted by "B" is reduced compared to that of the region denoted by "A" due to the formation of the depletion suppressing layer 6. The on resistance of the device in the first example is found to be 2.2 mΩ cm², which is smaller than the on resistance in the comparative example. To reduce the electric field below the trench, the trench 7 in the second example is formed so as to have a depth smaller than the depth of the trench 7 in the comparative example. With the trench having a smaller depth, the on resistance of the device is found to be 2.3 mΩ cm², which is still smaller than the on resistance in the comparative example. The comparisons among FIGS. 12 to 14 prove that the depletion suppressing layer 6 can reduce the on resistance.

Figure 15:
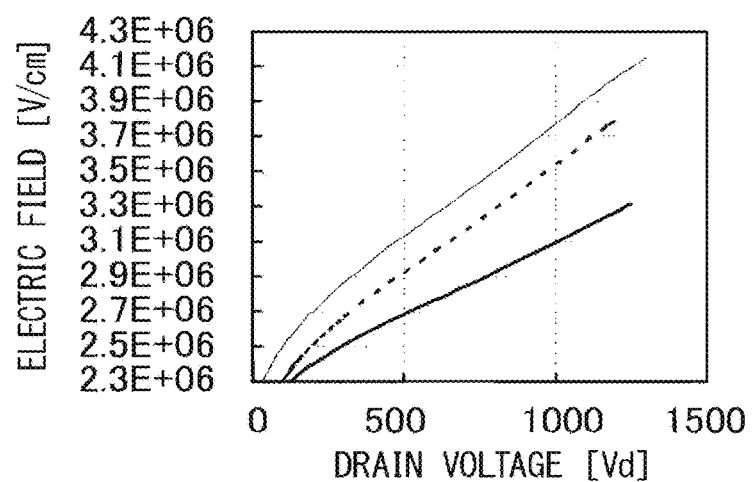
FIG. 15 A graph illustrating the relation between the drain voltage and the electric field strength of a gate insulating film of the silicon carbide semiconductor device according to the first embodiment and that of the silicon carbide semiconductor device according to the example compared to the first embodiment.
Figure 16:
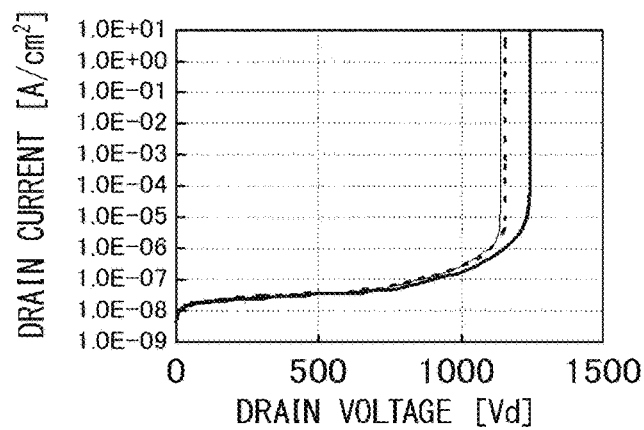
FIG. 16 A graph illustrating the off characteristic of the silicon carbide semiconductor device according to the first embodiment and the silicon carbide semiconductor device according to the example compared to the first embodiment.

FIG. 15 is a graph illustrating the relation between the drain voltage and the maximum electric field strength of the gate insulating film in the comparative example, the first example, and the second example. FIG. 16 is a graph illustrating the off characteristics (withstand voltage) in the comparative example, the first example, and the second example. In each of FIGS. 15 and 16, the broken line indicates values associated with the comparative example, the solid line indicates values associated with the first example, and the thick line indicates values associated with the second example.

According to the first example in which the trench has the same depth as that of the trench in the comparative example, the electric field strength of the gate insulating film is increased as illustrated in FIG. 15 due to the formation of the depletion suppressing layer 6. However, as illustrated in FIG. 16, the withstand voltage is about 1160 V, which is substantially the same as the withstand voltage in the comparative example. Owing to the depletion suppressing layer 6, the on resistance can be reduced while the withstand voltage is in substantially the same state.

According to the second example in which the trench 7 has a smaller depth, it is proved that the electric field strength of the gate insulating film is smaller than that of the gate insulating film in the comparative example as illustrated in FIG. 15. The decrease rate of the electric field strength increases with increasing drain voltage, indicating that this configuration is more effective during the application of a high bias. As illustrated in FIG. 16, the withstand voltage can be improved to about 1240 V according to the second example. In the second example, it is proved that both the on characteristic (on resistance) and the off characteristic (withstand voltage) can be improved in such a way that the on resistance is reduced owing to the formation of the depletion suppressing layer 6 and that the electric field below the trench is reduced owing to the formation of the trench 7 having a smaller depth.

In this embodiment, the planar arrangement of cells may have a stripe pattern or a lattice pattern as described above. If the planar arrangement of cells has a lattice pattern as illustrated in FIG. 8, the area of the side surfaces of the protective layers 8 is greater, and thus the resistance component attributable to the depletion layer extending from the protective layers 8 forms a larger proportion of the on resistance value in the silicon carbide semiconductor device as a whole. The application of the present invention to the planar arrangement in the cellular pattern can produce more remarkable effect of reducing the on resistance.

Figure 17:
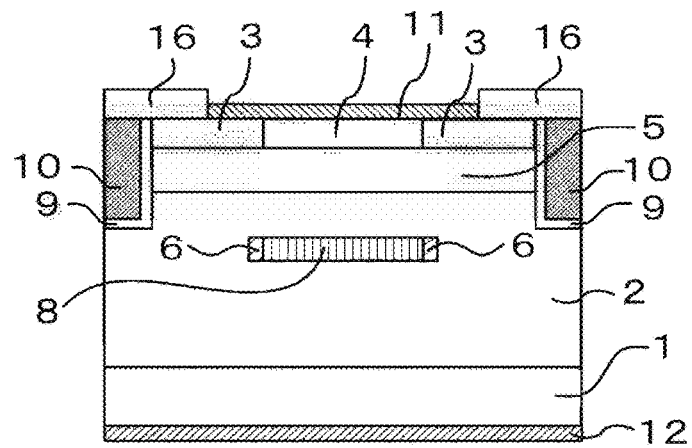
FIG. 17 A cross-sectional view of a silicon carbide semiconductor device according to a modification of the first embodiment.
Figure 18:
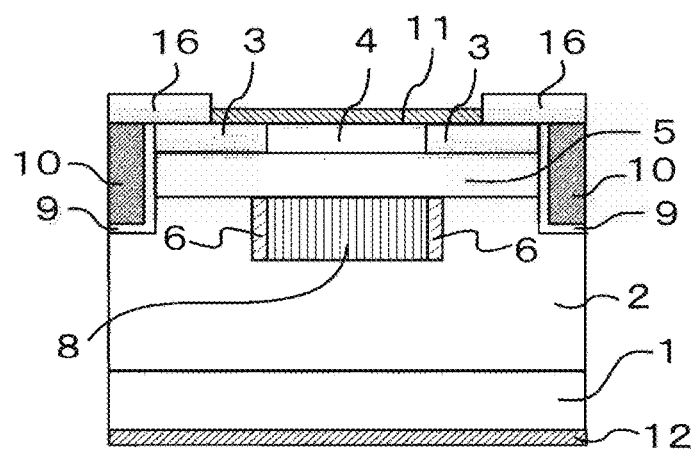
FIG. 18 A cross-sectional view of a silicon carbide semiconductor device according to another modification of the first embodiment.

In this embodiment, the individual protective layer 8 is formed in the drift layer 2 below the trench 7 in order to reduce the electric field applied to the gate insulating film 9. Alternatively, the protective layer 8 may be provided below the well region 5 as illustrated in FIG. 17 or 18 in order to reduce the electric field applied to the gate insulating film 9. In such a case as well, the depletion layer extending from the protective layer 8 is likely to reduce the path of an on current and the on resistance is likely to increase accordingly. Thus, the on resistance can be reduced by the depletion suppressing layer 6 provided on the side surface of the protective layer 8. In a modification in FIG. 17, the depletion suppressing layer 6 and the protective layer 8 are formed separately from the well region 5. In a modification in FIG. 18, the depletion suppressing layer 6 and the protective layer 8 are formed so as to extend from the well region 5. In the modifications in FIGS. 17 and 18, the front surface of the source region 3 or the front surface of the well contact region 4 may be implanted with ions to form the depletion suppressing layer 6 and the protective layer 8. Alternatively, in the formation of the semiconductor layer 20, the depletion suppressing layer 6 and the protective layer 8 may be epitaxially grown to be embedded in the semiconductor layer 20.

In this embodiment, the bottom surface of the trench 7 is implanted with ions such that the depletion suppressing layer 6 and the protective layer 8 are formed in the drift layer 2 below the trench 7, in other words, at least immediately below the trench 7. Alternatively, the depletion suppressing layer 6 and the protective layer 8 may be formed in such a way that the front surface of the semiconductor layer 20 is implanted with ions prior to the formation of the trench 7. In this case, the depletion suppressing layer 6 may be formed outboard with respect to the side surface of the trench 7. The bottom surface of the trench 7 may be implanted with ions such that the depletion suppressing layer 6 and the protective layer 8 are formed below the trench 7 as in this embodiment. Unlike the layer formation through the front surface of the semiconductor layer 20, this layer formation requires less ion implantation depths. Thus, a smaller amount of energy is required in the implantation and less defects are caused by the implantation. Consequently, the interface between the gate insulating film 9 and the semiconductor layer 20 has improved quality to suppress, for example, a leak current.

Second Embodiment

Figure 19:
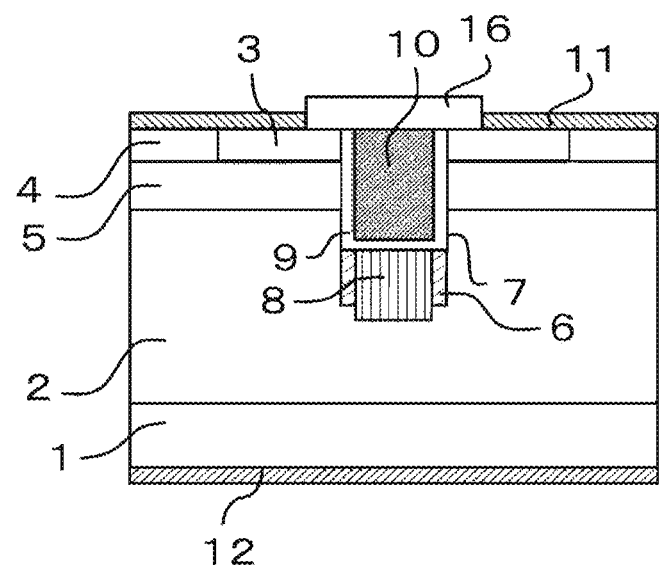
FIG. 19 A cross-sectional view of a silicon carbide semiconductor device according to a second embodiment.

FIG. 19 is a cross-sectional view of a silicon carbide semiconductor device according to a second embodiment. The difference between this embodiment and the first embodiment is in the configuration of the depletion suppressing layer 6, and the following description will be given solely on the difference.

As illustrated in FIG. 19, the depletion suppressing layer 6 is formed partially, that is, is formed only on the upper portion of the side surface of the protective layer 8. This means that the bottom surface of the depletion suppressing layer 6 is formed at a depth above the bottom surface of the protective layer 8.

As described above, if the depletion suppressing layer 6 is provided, the electric field in the drift layer 2 could increase. In particular, in a case where the protective layer 8 is provided to reduce the electric field applied to the gate insulating film 9, the boundary portion between the drift layer 2 and the bottom surface of the protective layer 8 is, in some cases, the breakdown point for determining the withstand voltage of the device.

In this embodiment, the bottom surface of the depletion suppressing layer 6 is formed at a depth above the bottom surface of the protective layer 8. Thus, the boundary portion between the drift layer 2 and the bottom surface of the protective layer 8, which can be the breakdown point, has an impurity concentration lower than the impurity concentration of the boundary portion in the first embodiment. This can reduce the electric field in the boundary portion.

Third Embodiment

Figure 20:
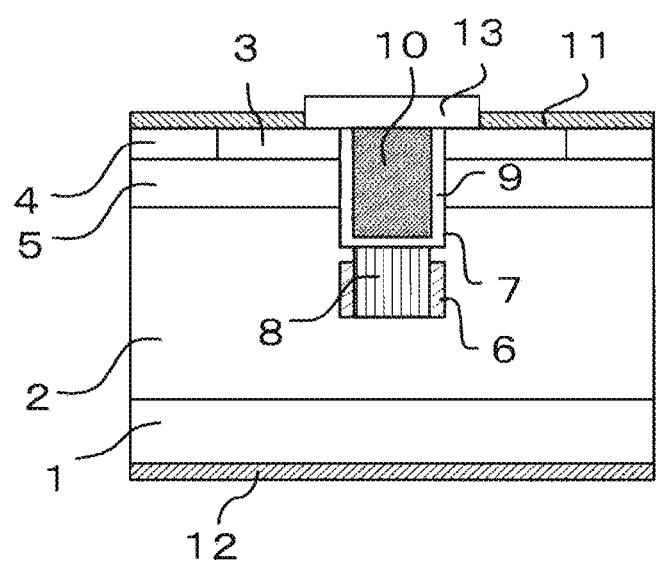
FIG. 20 A cross-sectional view of a silicon carbide semiconductor device according to a third embodiment.

FIG. 20 is a cross-sectional view illustrating a silicon carbide semiconductor device according to a third embodiment. The differences between this embodiment and the first embodiment and between this embodiment and the second embodiment are in the configuration of the depletion suppressing layer 6, and the following description will be given solely on the differences.

As illustrated in FIG. 20, the depletion suppressing layer 6 is formed partially, that is, is formed only on the lower portion of the side surface of the protective layer 8 in this embodiment. The protective layer 8 is in contact with the gate insulating film 9. The depletion suppressing layer 6, meanwhile, is not in contact with the gate insulating film 9 and is formed separately from the gate insulating film 9 with the drift layer 2 therebetween.

As described above, in a case where the depletion suppressing layer 6 is provided, the electric field around the depletion suppressing layer 6 is increased. In this embodiment, the depletion suppressing layer 6 is located separately from the gate insulating film 9 such that an increase in the electric field applied to the gate insulating film 9 is suppressed. The depletion layer extending from the protective layer 8 is affected by the gate potential and spreads out over a smaller length at close range from the gate insulating film 9. As illustrated in, for example, FIG. 9 associated with the comparative example mentioned in the first embodiment, the width of the depletion layer is narrowed in the close range from the gate insulating film 9. Thus, in a case where the depletion suppressing layer 6 is formed separately from the gate insulating film 9 as in this embodiment, the path of the on current is less likely to be reduced by the depletion layer extending from the protective layer 8. As long as the gap between the depletion suppressing layer 6 and the gate insulating film 9 is set at an appropriate value, the on resistance hardly increases.

Although the depletion suppressing layer 6 and the protective layer 8 are formed in such a manner that the bottom surfaces of the respective layers are located at the same depth in this embodiment, these layers may be formed as illustrated in FIG. 21. This means that the bottom surface of the depletion suppressing layer 6 may be formed at a depth above the bottom surface of the protective layer 8 as in the second embodiment.

Fourth Embodiment

In this embodiment, the depletion suppressing layer 6 is formed so as to exhibit concentration gradations (profile) in which the concentration decreases gradually or stepwise as the depth of the depletion suppressing layer 6 decreases in the vertical direction. As in the first embodiment, the formation of the depletion suppressing layer 6 in this embodiment may involve the formation of the trench 7 and the subsequent ion implantation performed to form the depletion suppressing layer 6 having the profile in which the impurity concentration decreases with decreasing depth. Alternatively, the depletion suppressing layer 6 may be formed in such a way that the impurity concentration is varied at different depths during the epitaxial growth.

In this embodiment, the impurity concentration in the depletion suppressing layer 6 decreases with decreasing depth. This can reduce an increase in the strength of the electric field applied to the gate insulating film 9 on the bottom surface of the trench 7 and suppress a reduction in the path of the on current to reduce the on resistance.

Fifth Embodiment

In this embodiment, the protective layer 8 is formed so as to exhibit concentration gradations in the lateral direction. The protective layer 8 has a profile in which the concentration decreases from the central portion toward the side surface of the protective layer 8, in other words, the impurity concentration decreases with decreasing distance to the depletion suppressing layer 6. To form the protective layer 8 in this embodiment, ion implantation is performed several times using the side wall mask 15, which is similar to the side wall mask in the first embodiment. For example, first ion implantation is performed with the side wall mask 15, and then another side wall mask 15 having a width greater than the width of the side wall mask 15 in the first ion implantation is formed. Subsequent to the first ion implantation, additional ion implantation is performed. This can increase the impurity concentration in the central portion and the protective layer 8 in this embodiment is formed accordingly.

In this embodiment, the protective layer 8 is formed in such a manner that the impurity concentration in the protective layer 8 decreases with decreasing distance to the depletion suppressing layer 6, so that the width of the depletion layer extending on the side surface of the protective layer 8 is reduced. Thus, the depletion suppressing layer 6 may have a smaller thickness or the depletion suppressing layer 6 may have a lower impurity concentration. This configuration can suppress an increase in the electric field strength associated with the formation of the depletion suppressing layer 6 and can suppress the width of the depletion layer extending from the protective layer 8.

The invention claimed is:

1. A silicon carbide semiconductor device comprising:
   a drift layer of a first conductivity type made of silicon carbide;
   a well region of a second conductivity type formed on said drift layer;
   a source region of the first conductivity type formed on said well region;
   a gate insulating film formed on an inner wall of a trench extending from a front surface of said source region through said well region, at least a part of a side surface of said gate insulating film being in contact with said drift layer;
   a gate electrode formed in said trench with said gate insulating film therebetween;
   a protective layer of the second conductivity type formed in said drift layer; and
   a depletion suppressing layer of the first conductivity type formed in said drift layer so as to be in contact with a side surface of said protective layer, said depletion suppressing layer having a first-conductivity-type impurity concentration higher than that of said drift layer and having a bottom surface located at a depth above a bottom surface of said protective layer.

2. The silicon carbide semiconductor device according to claim 1, wherein said protective layer is formed in said drift layer below said trench.

3. The silicon carbide semiconductor device according to claim 1, wherein said depletion suppressing layer is formed in said drift layer below said trench.

4. The silicon carbide semiconductor device according to claim 1, wherein
   said protective layer is formed to be in contact with a bottom surface of said gate insulating film.

5. The silicon carbide semiconductor device according to claim 4, wherein
   said depletion suppressing layer is formed to be in contact with the bottom surface of said gate insulating film, and
   a width of said protective layer in contact with a bottom surface of said trench is greater than a width of said depletion suppressing layer in contact with the bottom surface of said trench.

6. The silicon carbide semiconductor device according to claim 1, wherein
   said drift layer is located between said depletion suppressing layer and the bottom surface of said gate insulating film.

7. The silicon carbide semiconductor device according to claim 1, wherein said protective layer has a second-conductivity-type impurity concentration of $5.0 \times 10^{17}$ cm$^{-3}$ or higher and $5.0 \times 10^{18}$ cm$^{-3}$ or lower, and said depletion suppressing layer has a first-conductivity-type impurity concentration of $1.0 \times 10^{17}$ cm$^{-3}$ or higher and $5.0 \times 10^{17}$ cm$^{-3}$ or lower.

8. The silicon carbide semiconductor device according to claim 1, wherein said depletion suppressing layer is formed on a side surface of said protective layer, and said depletion suppressing layer is separate from a depletion suppressing layer formed on a side surface of another protective layer adjacent to said protective layer with said drift layer therebetween.

9. The silicon carbide semiconductor device according to claim 1, wherein said depletion suppressing layer has a first-conductivity-type impurity concentration that decreases with decreasing depth from the bottom surface of said depletion suppressing layer toward a front surface thereof.

10. The silicon carbide semiconductor device according to claim 1, wherein said protective layer has a second-conductivity-type impurity concentration that decreases from a central portion of said protective layer toward the side surface thereof.

\* \* \* \* \*